US008743602B2

(12) United States Patent
Lee

(10) Patent No.: US 8,743,602 B2
(45) Date of Patent: Jun. 3, 2014

(54) NONVOLATILE MEMORY DEVICE

(75) Inventor: Hyung-Min Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 13/337,200

(22) Filed: Dec. 26, 2011

(65) Prior Publication Data

US 2013/0083596 A1 Apr. 4, 2013

(30) Foreign Application Priority Data

Sep. 30, 2011 (KR) ........................ 10-2011-0099847

(51) Int. Cl.
*G11C 11/34* (2006.01)

(52) U.S. Cl.
USPC ............ 365/185.02; 365/185.05; 365/185.06; 365/185.11; 365/185.17; 365/189.14; 365/189.02; 365/189.05

(58) Field of Classification Search
USPC ............. 365/185.05, 185.06, 185.11, 185.17, 365/189.14, 189.02, 189.05, 185.02
See application file for complete search history.

(56) References Cited

U.S. PATENT DOCUMENTS 7,869,273 B2 1/2011 Lee et al.
2010/0332946 A1* 12/2010 Lee et al. ...................... 714/763

FOREIGN PATENT DOCUMENTS

KR 100539445 B1 12/2005

* cited by examiner

*Primary Examiner* — Fernando Hidalgo
(74) *Attorney, Agent, or Firm* — William Park & Associates Patent Ltd.

(57) ABSTRACT

Embodiments of present invention relate to a nonvolatile memory device that includes a first page buffer controlling any one of a first even bit line and a first odd bit line; a second page buffer controlling any one of a second even bit line and a second odd bit line; wherein the second page buffer operates the second odd bit line according to program when the first page buffer operates the first even bit line according to program, and the second page buffer operates the second even bit line according to program when the first page buffer operates the first odd bit line according to program.

5 Claims, 6 Drawing Sheets

NONVOLATILE MEMORY DEVICE

CROSS-REFERENCES TO RELATED APPLICATIONS

The present application claims priority under 35 U.S.C 119(a) to Korean Application No. 10-2011-0099847, filed on Sep. 30, 2011, in the Korean Intellectual Property Office, which is incorporated herein by reference in its entirety set forth in full.

BACKGROUND

1. Field of the Invention

Embodiments of the present invention relate to a semiconductor design technology, and more particularly, to a nonvolatile memory device capable of minimizing an occurrence of program interference between adjacent cells.

2. Description of the Related Art

In a nonvolatile memory device such as a NAND flash memory, a program cell threshold voltage (Vt) distribution type is an important factor that dominates a performance of devices.

Among phenomena that have the greatest affect on the program cell Vt distribution type between adjacent cells, there is a program interference phenomenon between adjacent cells. The program interference phenomenon may cause fluctuation in Vt values of cells due to a coupling effect between adjacent cells.

FIG. 1 is a diagram illustrating Vt distributions of cells for explaining an initial program operation of a NAND flash memory.

Referring to FIG. 1, when forming level distributions divided into 'ERASE', 'PV1', 'PV2', and 'PV3' so as to generate Vt distributions of 2-bit multi-level cells in a NAND flash memory, a scheme of sequentially programming all the level distributions by starting from 'ERASE' is performed. This sequential programming may cause the amount of interference suffered when adjacent cells are programmed to increase as the programming sequence is executed. This interference may greatly fluctuate the level distributions of the Vt between the adjacent cells.

FIG. 2 is a diagram illustrating the Vt distributions of cells for explaining program operations proposed so as to solve problems that may occur during an initial program operation of the NAND flash memory illustrated in FIG. 1.

Referring to FIG. 2, when forming the level distributions divided into 'ERASE', 'PV1', 'PV2', and 'PV3' so as to generate the Vt distributions of the 2-bit multi-level cells in the NAND flash memory, a scheme of first forming least significant bit ('LSB') distribution in the 'ERASE' and then, forming 'PV1' distribution in the 'ERASE' or the 'PV1' distribution or the 'PV3' distribution in the 'LSB' is performed, such that the amount of interference suffering when the adjacent cells are programmed may be further reduced as compared with the program scheme illustrated in FIG. 1, thereby making the fluctuation in the level distributions of the Vt between the adjacent cells relatively small.

However, as a cell size of the NAND flash memory is further reduced, it is difficult to solve the interference phenomenon affecting the adjacent cells just by changing the program operation scheme as illustrated in FIG. 2.

FIG. 3A is a block diagram for explaining a scheme of controlling a program operation sequence between adjacent cells according to an even-odd bit-line (EOBL) program operation so as to minimize an influence of the interference phenomenon on Vt distributions between the adjacent cells.

FIG. 3B is a block diagram for explaining problems with the scheme of controlling the program operation sequence between the adjacent cells according to the even-odd bit-line (EOBL) program operation illustrated in FIG. 3A.

FIG. 4 is a block diagram for explaining the scheme of controlling the program operation sequence between adjacent cells according to an all bit-line (ABL) program operation so as to minimize an influence of the interference phenomenon on Vt distributions between the adjacent cells.

Referring to FIG. 3A, in order to reduce the interference phenomenon between adjacent cells, the LSB program operation is performed on all the adjacent cells, followed by performing an most significant bit (MSB) program operation on specific cells according to the even-odd bit-line (EOBL) program operation, thereby minimizing the interference phenomenon affecting specific cells.

Thus, the LSB program operation is performed in all the adjacent cells followed by the MSB program operation. Because the program operations are repeatedly performed in adjacent cells, fluctuations in the Vt distributions are large due to the interference phenomenon affecting the specific cells.

That is, as illustrated in FIG. 3B, when expanding the structure of FIG. 3A, the LSB program operation is performed in all the adjacent cells and then the MSB program operation is performed. The program operations, however, may be performed a maximum of three times in cells adjacent to the specific cells. When considering the recent trend of reducing cell size, fluctuations in the Vt of the specific cells due to the interference phenomenon affecting the specific cells, may cause wrong data to be programmed in the specific cells.

In order to solve problems with the scheme of controlling the program operation sequence between adjacent cells according to the even-old bit-line (EOBL) program operation illustrated in FIGS. 3A and 3B, the all bit-line (ABL) program operation scheme simultaneously performing the program operations of all the adjacent memory cells in a word line direction as illustrated in FIG. 4 has been proposed. However, the above-mentioned ABL program operation is a scheme in which page buffers are independently provided for each bit line and therefore, the occupied area is significantly large, which is not an appropriate scheme for solving problems of the type of controlling the program operation sequence between the adjacent cells illustrated in FIGS. 3A and 3B.

SUMMARY

An object of the present invention is to provide a scheme of controlling a program operation sequence between adjacent cells so as to minimize occurrence of program interference between the adjacent cells.

An embodiment of the present invention relates to a nonvolatile memory device, including: a first page buffer controlling any one of a first even bit line and a first odd bit line; a second page buffer controlling any one of a second even bit line and a second odd bit line; wherein the second page buffer operates the second odd bit line according to program when the first page buffer operates the first even bit line according to program, and the second page buffer operates the second even bit line according to program when the first page buffer operates the first odd bit line according to program.

Another embodiment includes a method of programming a memory device. The method may comprise performing a first programming operation using a first even bit line and a second odd bit line, at a first time. And performing a second programming operation using a first odd bit line and a second even bit line, at a second time. Wherein the first even bit line and the first odd bit line are part of a first group and the second even bit line and the second odd bit line are part of a second group.

Yet another embodiment includes a memory device comprising a first page buffer configured to program memory with a first even bit line at a first time and a first odd bit line at a second time. And a second page buffer configured to program memory with a second even bit line at the second time and a second odd bit line at the first time.

As set forth above, the exemplary embodiments of the present invention can simultaneously program between the adjacent cells by controlling the two page buffers including even and odd bit lines, respectively, to perform the program operations in a symmetrical form to each other, thereby minimizing the occurrence of the program interference between the adjacent cells.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, example embodiments of the present invention will be described in detail with reference to the accompanying drawings. However, the present invention is not limited to embodiments described below, but may be configured in various forms. However, embodiments are provided to inform those skilled in the art about the scope of embodiments of the present invention.

Figure 1:
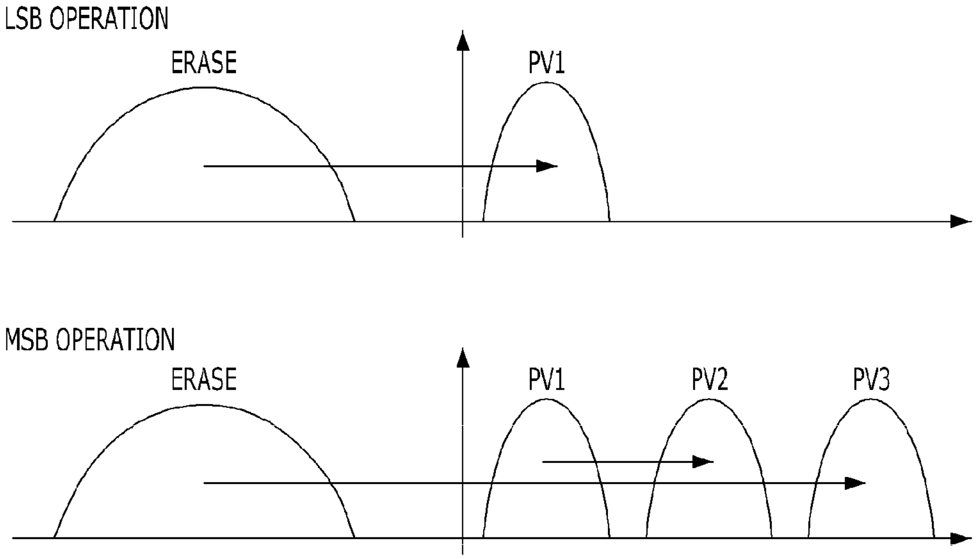
FIG. 1 is a diagram illustrating Vt distributions of cells for explaining an initial program operation of a NAND flash memory.
Figure 2:
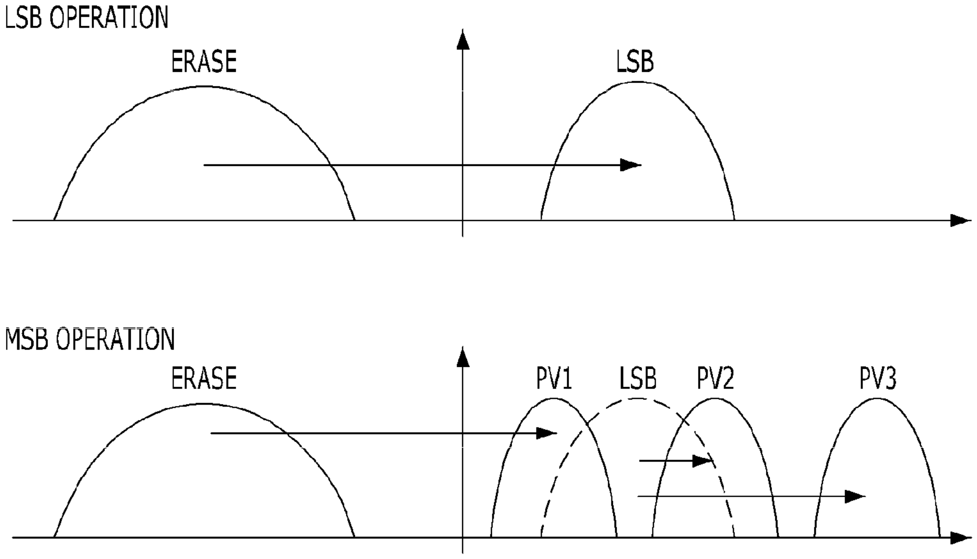
FIG. 2 is a diagram illustrating Vt distributions of cells for explaining program operations proposed so as to solve problems occurring during the initial program operation of the NAND flash memory illustrated in FIG. 1.
Figure 3A:
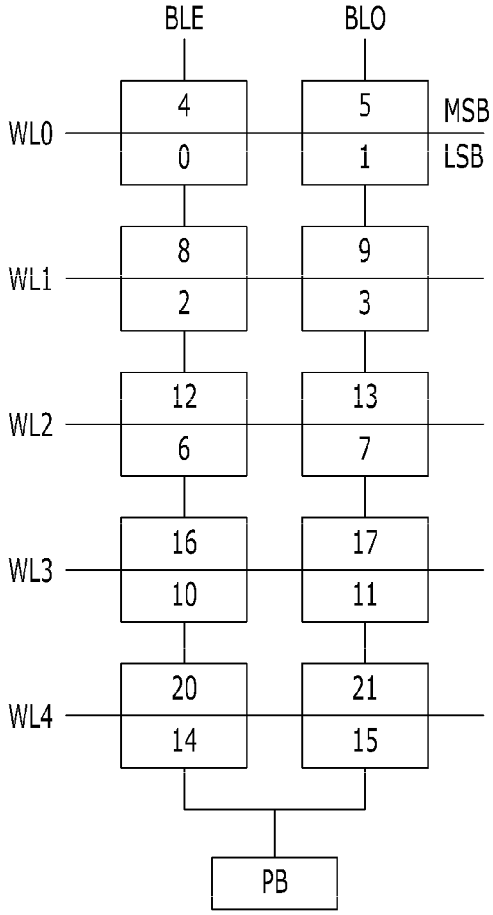
FIG. 3A is a block diagram for explaining a scheme of controlling a program operation sequence between adjacent cells according to an even-odd bit-line (EOBL) program operation so as to minimize an interference phenomenon on the Vt distributions between the adjacent cells.
Figure 3B:
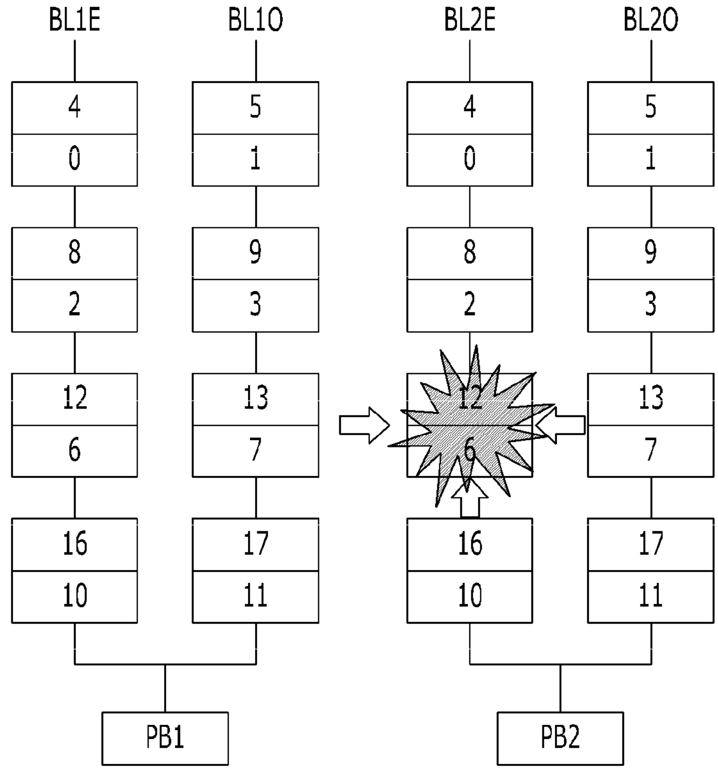
FIG. 3B is a block diagram for explaining problems with the scheme of controlling the program operation sequence between the adjacent cells according to the even-odd bit-line (EOBL) program operation illustrated in FIG. 3A.
Figure 4:
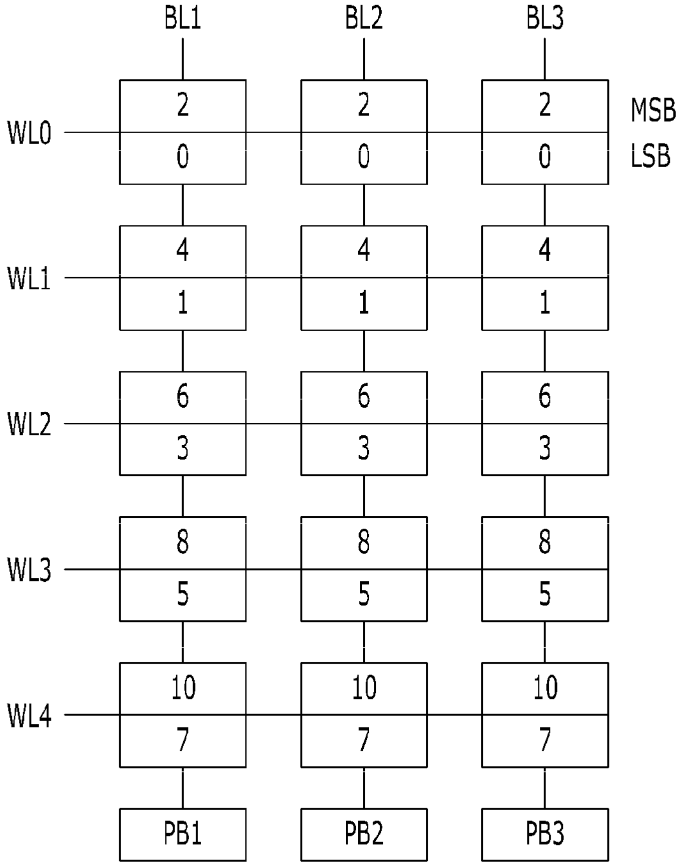
FIG. 4 is a block diagram for explaining the scheme of controlling the program operation sequence between adjacent cells according to an all bit-line (ABL) program operation so as to minimize the interference phenomenon on the Vt distributions between the adjacent cells.
Figure 5A:
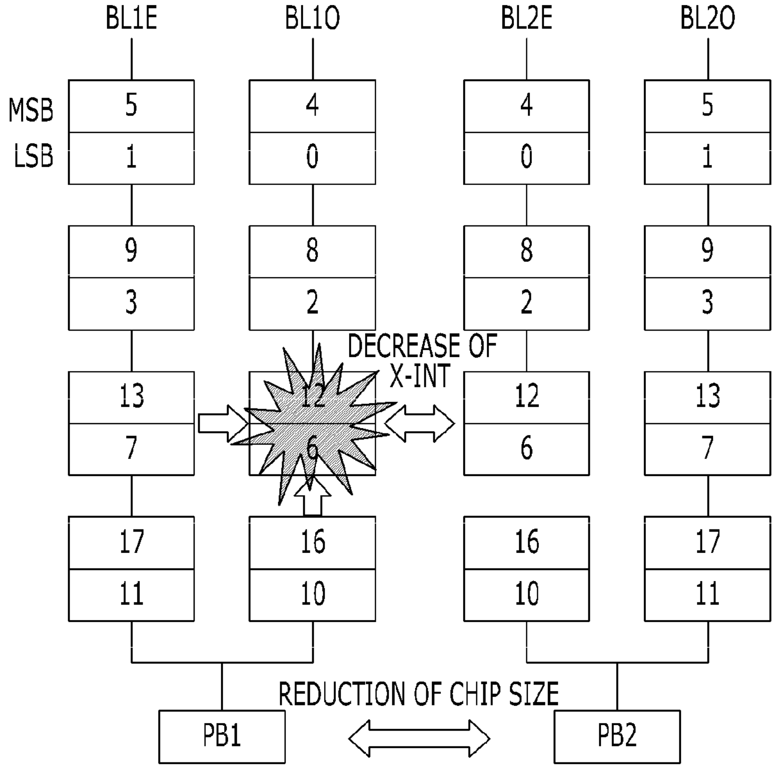
FIGS. 5A and 5B are block diagrams for explaining a scheme for controlling a program operation sequence between the adjacent cells according to an embodiment of the present invention so as to minimize the influence of the interference phenomenon on the Vt distributions between the adjacent cells.
Figure 5B:
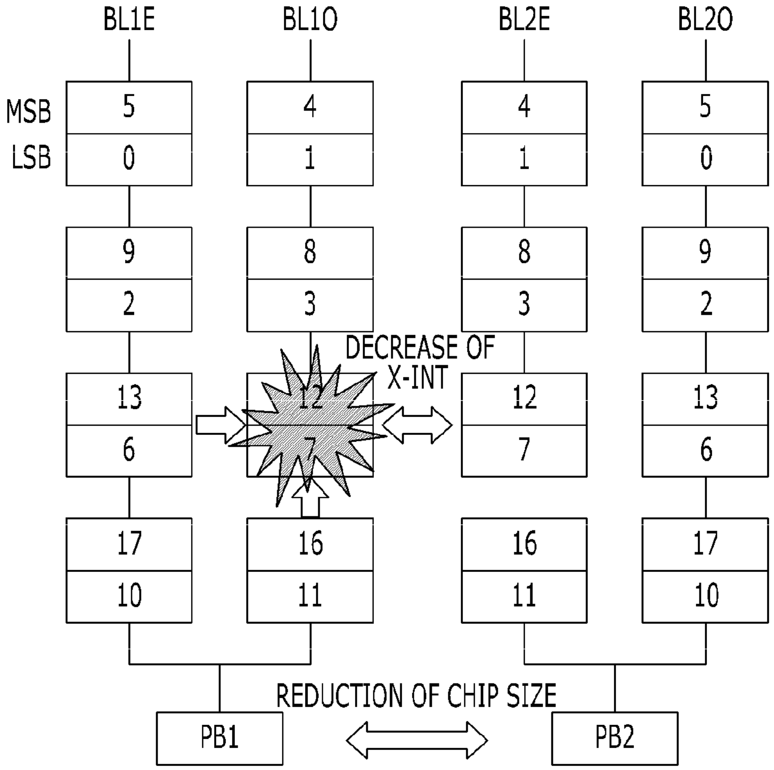

FIGS. 5A and 5B are block diagrams for explaining a scheme of controlling a program operation sequence between adjacent cells according to an embodiment of the present invention so as to minimize an interference phenomenon on Vt distributions between adjacent memory cells.

Referring to FIGS. 5A and 5B, a nonvolatile memory device according to an embodiment of the present invention includes a first page buffer PB1 controlling any one of a first even bit line BL1E and a first odd bit line BL1O. A second page buffer PB2 controlling any one of a second even bit line BL2E and a second odd bit line BL2O. When the first page buffer PB1 operates the first even bit line BL1E according to program (i.e., the first page buffer PB1 may be using the first even bit line BL1E to program memory cells), the second page buffer PB2 operates the second odd bit line BL2O according to program and when the first page buffer PB1 operates the first odd bit line BL1O according to program, the second page buffer PB operates the second even bit line BL2E according to program.

In this configuration, the first page buffer PB1 and the second page buffer PB2 are disposed adjacent to each other as illustrated in FIGS. 5A and 5B. In this case, the adjacent disposition means that the first page buffer PB1 and the second page buffer PB2 are disposed to be physically adjacent to each other. Accordingly, components performing operations similar (or the same) to the operations of the first page buffer PB1 or the second page buffer PB2 cannot be physically disposed between the first page buffer PB1 and the second page buffer PB2.

In addition, the first even bit line BL1E and the first odd bit line BL1O are disposed adjacent to each other and thus, another bit line may not be disposed between the first even bit line BL1E and the first odd bit line BL1O.

In addition, the second even bit line BL2E and the second odd bit line BL2O of which the operations are controlled by the second page buffer PB2 are disposed to be adjacent to each other and thus, another bit line may not be disposed between the second even bit line BL2E and the second odd bit line BL2O.

Further, considering that many bit lines may correspond to one page of a flash memory device, the configuration illustrated in FIGS. 5A and 5B may be expanded into a type comprising another second page buffer (substantially similar to the second page buffer PB2) at the other side of the first page buffer PB1, and another first page buffer (substantially similar to the first page buffer PB1) may be disposed at the other side of the second page buffer PB2. Thus, the flash memory device may be comprised of a plurality alternating first and second page buffers disposed adjacent to each other where each first page buffer is configured in a manner substantially similar to the first page buffer PB1, and each second page buffer is configured in a manner substantially similar to the second page buffer PB2. Accordingly, an embodiment of the present invention may have the following type.

First, the first even bit line BL1E of the corresponding first page buffer PB1 may be disposed so as to be adjacent to the first odd bit line BL1O on one side, and to be adjacent to a second odd bit line BL2O of a second page buffer (not pictured) disposed at the other side of the first even bit line BL1E. The first odd bit line BL1O of the corresponding first page buffer PB1 may be disposed so as to be adjacent to the first even bit line BL1E on one side, and to be adjacent to the second even bit line BL2E of the second page buffer PB2 disposed at the other side of the first odd bit line BL1O.

Similarly, the second even bit line BL2E of the corresponding second page buffer PB2 may be disposed so as to be adjacent to the second odd bit line BL2O on one side, and to be adjacent to the first odd bit line BL1O of the first page buffer PB1 disposed at the other side of the second even bit line BL2E. The second odd bit line BL2O of the corresponding second page buffer PB2 may be disposed so as to be adjacent to the second even bit line BL2E on one side, and to be adjacent to a first even bit line of another first page buffer (not pictured) disposed at the other side of the second odd bit line BL2O.

As such, when the first even bit line BL1E and the first odd bit line BL1O and the second even bit line BL2E and the second odd bit line BL2O are alternately disposed so as to be adjacent to each other, when the first page buffer PB1 operates the first even bit line BL1E according to program, the second page buffer PB2 operates the second odd bit line BL2O according to program and when the first page buffer PB1 operates the first odd bit line BL1O according to program, the second page buffer PB2 operates the second even bit line BL2E according to program, such that the frequency of performing the program operations in cells adjacent to specific cells may be reduced to a maximum of two times.

Further, the program operation of the first even bit line BL1E and the first odd bit line BL1O in the first page buffer PB1 and the program operation of the second even bit line BL2E and the second odd bit line BL2O in the second page buffer PB2 mainly use an increment step pulse programming (ISPP) scheme, such that a read operation is performed during the program operation.

As described above, when the read operation is performed during the program operation due to the use of the ISPP scheme, an embodiment of the present invention may perform the read operation during the program operation by dividing the read operation into two types as follows.

The first even bit line BL1E and the first odd bit line BL1O may not simultaneously perform the program or read operation, and the second even bit line BL2E and the second odd bit line BL2O may not simultaneously perform the program or the read operation. Accordingly, the program operation by first even bit line BL1E and the second odd bit line BL2O may be simultaneously performed, and the read operation by the first even bit line BL1E and the second odd bit line BL2O may be simultaneously performed. The program operation and the read operation in the first odd bit line BL1O and the second even bit line BL2E may be similarly simultaneously performed.

A first way of performing the read operation is to perform the read operation simultaneously as previously described, while performing the program operation as previously described. Thus, the program operation may be simultaneously performed by the first even bit line BL1E and the second odd bit line BL2O. The program operation may also be simultaneously performed by the first odd bit line BL1O and the second even bit line BL2E. Similarly, the read operation may be simultaneously performed by the first even bit line BL1E and the second odd bit line BL2O. The read operation may also be simultaneously performed by the first odd bit line BL1O and the second even bit line BL2E. In the above-mentioned type, data read between the adjacent bit lines are output at the same timing in a state in which a bit-line shielding effect disappears due to the performance of the read operation between the adjacent cells.

A second way of performing the read operation is to perform the read operation with a predetermined time difference. Again the program operation is performed as previously described, that is, the program operation is simultaneously performed by the first even bit line BL1E and the second odd bit line BL2O and, the first odd bit line BL1O and the second even bit line BL2E. The read operation, on the other hand, may be performed at a predetermined time difference. For example, the first even bit line BL1E read operation may be performed at a predetermined time difference from the second odd bit line BL2O read operation. This time difference may also apply to the read operation involving the first odd bit line BL1O and the second even bit line BL2E. Even in the second way of performing the read operation, the bit-line shielding effect similarly disappears due to the performance of the read operation between the adjacent cells, but the data read between the adjacent bit lines are output at a predetermined time difference, such that the read data may be maintained in a more stable state.

Further, referring to FIG. 5A, a scheme of first programming the first odd bit line BL1O and then programming the first even bit line BL1E may be performed at a time of performing a LSB program operation in the first page buffer PB1, before a scheme of first programming the first odd bit line BL1O and then programming the first even bit line BL1E may be performed even at a time of a MSB program operation.

Similarly, a scheme of first programming the second even bit line BL2E and then programming the second odd bit line BL2O may be performed at the time of performing the LSB program operation in the second page buffer PB2, before the scheme of first programming the second even bit line BL2E and then programming the second odd bit line BL2O may be performed even at the time of the MSB program operation.

Further, referring to FIG. 5B, the scheme of first programming the first odd bit line BL1O and then programming the first even bit line BL1E may be performed at the time of performing the LSB program operation in the first page buffer PB1, before the scheme of first programming the first even bit line BL1E and then programming the first odd bit line BL1O may be performed at the time of the MSB program operation.

Similarly, the scheme of first programming the second even bit line BL2E and then programming the second odd bit line BL2O may be performed at the time of performing the LSB program operation in the second page buffer PB2, before the scheme of first programming the second odd bit line BL2O and then programming the second even bit line BL2E may be performed at the time of the MSB program operation.

As such, as illustrated in FIG. 5B, the case in which the LSB program operation sequence and the MSB program operation sequence are performed in a mirroring type as illustrated in FIG. 5B, the previously described interference phenomenon degree between adjacent cells may be further mitigated over the case in which the LSB program operation sequence and the MSB program operation sequence are similarly performed as illustrated in FIG. 5A. This further mitigation may provide for a margin of the Vt distributions of cells that may be more secured in the case of performing the program operation in the type as illustrated in FIG. 5B.

As described above, embodiments of the present invention perform a control to perform a program operation in a symmetrical way according to a scheme of simultaneously programming the even bit line of the first page buffer and the odd bit line of the second page buffer adjacent to each other. And simultaneously programming the odd bit line of the first page buffer and the even bit line of the second page buffer adjacent to each other. Accordingly, the adjacent first and second page buffers even including the even and odd bit lines are provided so as to simultaneously program between the adjacent cells, thereby minimizing the occurrence of the program interference between the adjacent cells.

Embodiments of the present invention are not limited to the above-mentioned embodiments and the accompanying drawings. Those skilled in the art will appreciate that various modifications, additions and substitutions are possible, without departing from the scope and spirit of embodiments of the invention as disclosed in the accompanying claims.

What is claimed is:

1. A method of programming a memory device, comprising:

performing a first programming operation using a first even bit line and a second odd bit line, at a first time; and performing a second programming operation using a first odd bit line and a second even bit line, at a second time, wherein the first even bit line and the first odd bit line are part of a first group and the second even bit line and the second odd bit line are part of a second group.

2. The method of claim 1 where in the first group is controlled by a first page buffer and the second group is controlled by a second page buffer.

3. The method of claim 1 further comprising:

performing a first read operation on the first odd bit line and the second even bit line at the first time; and performing a second read operation on the first even bit line and the second odd bit line at the second time.

4. The method of claim 1, further comprising:

performing a first read operation such that the first odd bit line is read at a different time as the second even bit line; and performing a second read operation such that the first even bit line is read at a different time as the second odd bit line.

5. The method of claim 1, wherein the memory device is programmed using an increment step pulse programming scheme.

* * * * *